United States Patent
Matthey et al.

(10) Patent No.: US 12,283,667 B2
(45) Date of Patent: Apr. 22, 2025

(54) BATTERY MANAGEMENT APPARATUS, BATTERY MANAGEMENT METHOD, AND BATTERY ENERGY STORAGE SYSTEM

(71) Applicant: VEHICLE ENERGY JAPAN INC., Hitachinaka (JP)

(72) Inventors: Fanny Matthey, Tokyo (JP); Ryohhei Nakao, Tokyo (JP); Hiroshi Morikawa, Hitachinaka (JP)

(73) Assignee: VEHICLE ENERGY JAPAN INC., Hitachinaka (JP)

( * ) Notice: Subject to any disclaimer, the term of this patent is extended or adjusted under 35 U.S.C. 154(b) by 1042 days.

(21) Appl. No.: 17/264,508

(22) PCT Filed: Mar. 12, 2019

(86) PCT No.: PCT/JP2019/010082
§ 371 (c)(1),
(2) Date: Jan. 29, 2021

(87) PCT Pub. No.: WO2020/026502
PCT Pub. Date: Feb. 6, 2020

(65) Prior Publication Data
US 2021/0336299 A1    Oct. 28, 2021

(30) Foreign Application Priority Data

Jul. 30, 2018   (JP) ................. 2018-142467

(51) Int. Cl.
*H01M 10/44* (2006.01)
*G01R 31/36* (2020.01)
(Continued)

(52) U.S. Cl.
CPC ...... *H01M 10/443* (2013.01); *G01R 31/3648* (2013.01); *H01M 10/48* (2013.01); *H02J 7/0048* (2020.01); *H01M 2010/4271* (2013.01)

(58) Field of Classification Search
None
See application file for complete search history.

(56) References Cited

U.S. PATENT DOCUMENTS

2014/0156209 A1* 6/2014 Yuan ................. G06F 17/00
                                                                702/63
2014/0176085 A1* 6/2014 Maruno ............. G01R 31/392
                                                                320/162
(Continued)

FOREIGN PATENT DOCUMENTS

GB          2556881 A  *  6/2018 ........... B60L 11/187
JP     2010-273492 A     12/2010
(Continued)

OTHER PUBLICATIONS https://math.libretexts.org/Bookshelves/Precalculus/Precalculus_1e_(OpenStax)/12%3A_Introduction_to_Calculus/12.03%3A_Continuity (Accessed Jul. 31, 2024) (Year: 2024).*
(Continued)

*Primary Examiner* — Jonathan G Leong
*Assistant Examiner* — Claire A Rutiser
(74) *Attorney, Agent, or Firm* — FOLEY & LARDNER LLP

(57) ABSTRACT

A battery management apparatus for managing a chargeable-dischargeable battery includes: a battery status calculation unit that calculates a degradation degree of the battery; a degradation speed calculation unit that calculates a degradation speed of the battery on the basis of the degradation degree; and an upper limit temperature setting unit that sets an upper limit temperature of the battery on the basis of the degradation speed, wherein the upper limit temperature setting unit raises the upper limit temperature in association with a decrease of the degradation speed.

8 Claims, 12 Drawing Sheets

(51) Int. Cl.
H01M 10/42 (2006.01)
H01M 10/48 (2006.01)
H02J 7/00 (2006.01)

(56) References Cited

U.S. PATENT DOCUMENTS

2015/0070024 A1    3/2015  Kim
2016/0285136 A1    9/2016  Abe
2017/0160349 A1    6/2017  Iida
2018/0145379 A1*   5/2018  You .................... H01M 10/486
2018/0210036 A1    7/2018  Yamauchi

FOREIGN PATENT DOCUMENTS

| | | |
|---|---|---|
| JP | 2015-052590 A | 3/2015 |
| JP | 2016-014606 A | 1/2016 |
| JP | 2016-178052 A | 10/2016 |
| WO | WO-2017/043239 A1 | 3/2017 |

OTHER PUBLICATIONS

International Search Report with English translation and Written Opinion issued in corresponding application No. PCT/JP2019/010082 dated May 28, 2019.

* cited by examiner

BATTERY MANAGEMENT APPARATUS, BATTERY MANAGEMENT METHOD, AND BATTERY ENERGY STORAGE SYSTEM

TECHNICAL FIELD

The present invention relates to a battery management apparatus, a battery management method, and a battery energy storage system.

BACKGROUND ART

In recent years, the use of an electric power production and supply system that generates electric power by utilizing renewable energy such as sunlight and wind power and attempts to stabilize outputs by using a battery energy storage system (BESS) has been expanding from the viewpoint of the global warning problem. Furthermore, such a battery energy storage system is also widely used in transportation systems such as vehicles from the viewpoint of exhaust gas regulations.

A conventional and common battery energy storage system is configured by including a battery in which a plurality of battery cells are combined, a cooling system for adjusting a temperature by cooling down the battery, and a battery management apparatus for maintaining the system in a safe state by performing battery charge-discharge control. The above-described conventional battery energy storage system forcedly cools down the battery by using the cooling system so that the battery temperature becomes equal to or lower than a preset upper limit temperature.

On the other hand, a reduction of the size or weight is sometimes important depending on the intended use of the battery energy storage system. Accordingly, a battery energy storage system which uses a battery of a natural cooling method and in which the cooling system is not provided is also used. With the above-described battery energy storage system of the natural cooling method, it is necessary to control charging/discharging of the battery in consideration of an operational status and an ambient environment so that the battery temperature will not exceed the upper limit temperature. Under this circumstance, the upper limit temperature of the battery is always set to a constant value normally over the entire usage period of the battery. Meanwhile, as degradation of the battery progresses by repeating charging and discharging, internal resistance of the battery increases accordingly and, therefore, a calorific value per charging-discharging current increases. As a result, as the usage period of the battery becomes longer, the charging-discharging current which can be made to pass through the battery decreases and the performance of the battery energy storage system degrades. Therefore, when operating the battery energy storage system of the natural cooling method, it is necessary to appropriately adjust the upper limit temperature of the battery so that both system performance and a utilization rate can be maintained to be good over the entire operation period.

A technology described in PTL 1 is known with regard to the charge-discharge control according to the degraded state of the battery. PTL 1 discloses a storage battery control apparatus including: a battery information acquisition unit that acquires information of a storage battery; a degradation progress speed operation unit that calculates a degradation progress speed of the storage battery on the basis of the information acquired by the battery information acquisition unit; a limiting value setting unit that sets a limiting value for controlling charging and discharging of the storage battery on the basis of the degradation progress speed calculated by the degradation progress speed operation unit; a timing judgment unit that judges timing to output the limiting value on the basis of the information acquired by the battery information acquisition unit; and a limiting value output unit that outputs the limiting value on the basis of the timing judged by the timing judgment unit.

CITATION LIST

Patent Literature

PTL 1: WO2017/043239

SUMMARY OF THE INVENTION

Problems to be Solved by the Invention

The storage battery control apparatus of PTL 1 can change the charging-discharging current of the battery and the limiting value of the SOC according to the degraded state of the battery, but it is difficult to adjust the upper limit temperature appropriately.

Means to Solve the Problems

A battery management apparatus according to the present invention is an apparatus for managing a chargeable-dischargeable battery and includes: a battery status calculation unit that calculates a degradation degree of the battery; a degradation speed calculation unit that calculates a degradation speed of the battery on the basis of the degradation degree; and an upper limit temperature setting unit that sets an upper limit temperature of the battery on the basis of the degradation speed, wherein the battery status calculation unit calculates an internal resistance increase amount of the battery as the degradation degree; wherein the degradation speed calculation unit calculates a time derivative value of the internal resistance increase amount of the battery as the degradation speed; and wherein the upper limit temperature setting unit raises the upper limit temperature in association with a decrease of the degradation speed.

A battery management method according to the present invention is a method for managing a chargeable-dischargeable battery and is executed by a computer to calculate an internal resistance increase amount of the battery as a degradation degree of the battery, calculate a time derivative value of the internal resistance increase amount as a degradation speed of the battery on the basis of the calculated degradation degree, and set an upper limit temperature of the battery on the basis of the calculated degradation speed to raise the upper limit temperature in association with a decrease of the degradation speed.

A battery energy storage system according to the present invention includes: the battery management apparatus: a chargeable-dischargeable battery; and a charging-discharging apparatus that performs charging and discharging of the battery on the basis of a permissible value of a charging-discharging current of the battery which is set in accordance with an upper limit temperature of the battery which is raised by the battery management apparatus.

Advantageous Effects of the Invention

The upper limit temperature of the battery can be adjusted appropriately according to the degraded state of the battery according to the present invention.

DESCRIPTION OF EMBODIMENTS

Embodiments of the present invention will be explained below.

First Embodiment

Figure 1:
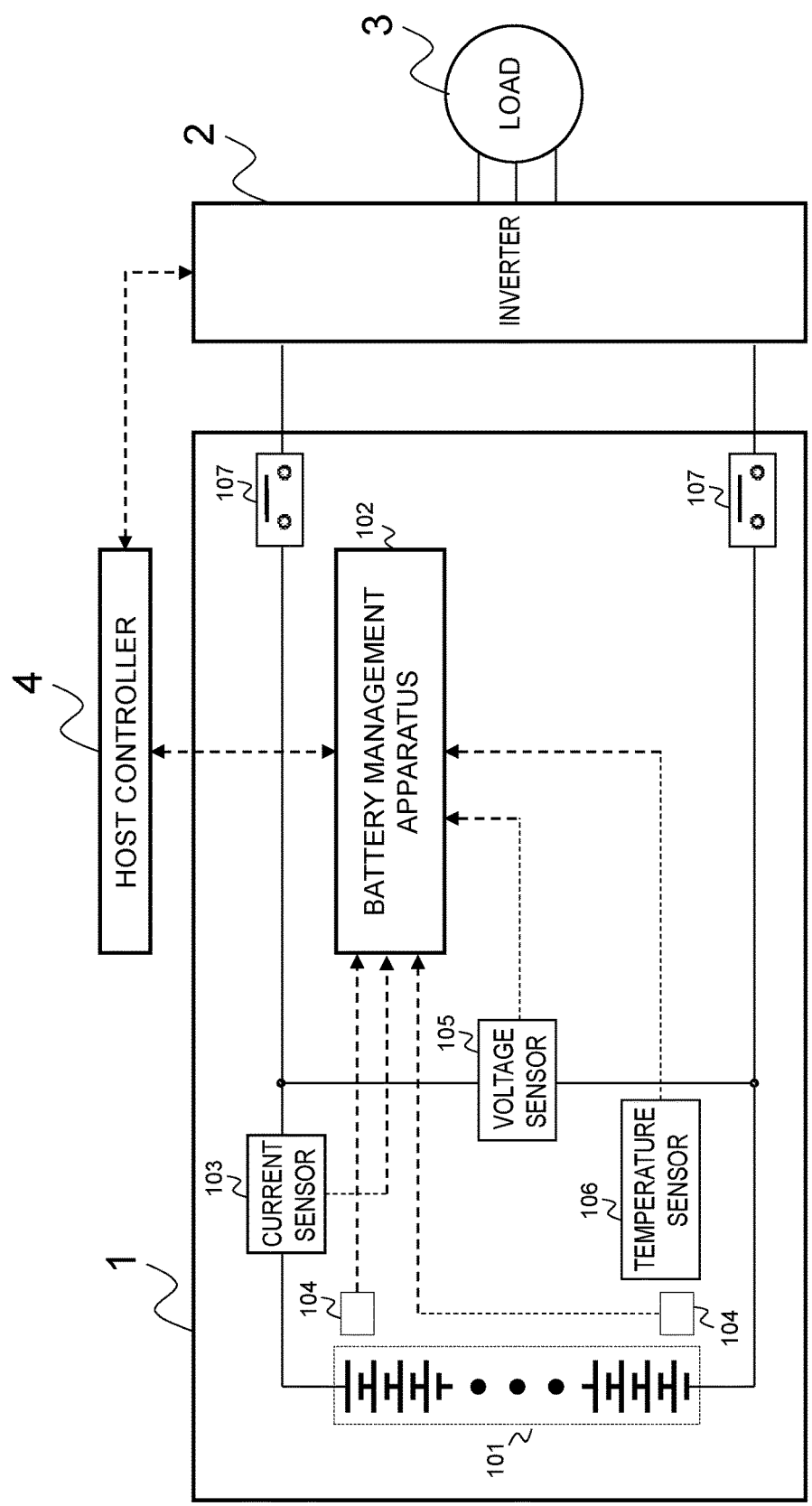
FIG. 1 is a schematic configuration diagram of a battery energy storage system according to one embodiment of the present invention.

FIG. 1 is a schematic configuration diagram of a battery energy storage system according to one embodiment of the present invention. A battery energy storage system (BESS) 1 illustrated in FIG. 1 includes an assembled battery 101, a battery management apparatus 102, a current sensor 103, a cell controller 104, a voltage sensor 105, a temperature sensor 106, and a relay 107. The battery energy storage system 1 is coupled to a load 3 such as an alternating current motor via an inverter 2. The battery energy storage system 1 and the inverter 2 are coupled to a host controller 4 via a communication line which is not illustrated in the drawing.

The assembled battery 101 is configured by connecting a plurality of chargeable-dischargeable battery cells serially/parallelly. When performing power running of the load 3, direct-current power discharged from the assembled battery 101 is converted to alternating-current power by the inverter 2 and then supplied to the load 3. Furthermore, when performing regenerative operation of the load 3, the alternating-current power which is output from the load 3 is converted to the direct-current power by the inverter 2 and is charged to the assembled battery 101. Charging and discharging of the assembled battery 101 are performed by such actions of the inverter 2. The actions of the inverter 2 are controlled by the host controller 4.

The current sensor 103 detects an electric current flowing through the assembled battery 101 and outputs the detection result to the battery management apparatus 102. The cell controller 104 detects a voltage of each battery cell of the assembled battery 101 and outputs the detection result to the battery management apparatus 102. The voltage sensor 105 detects the voltage (total voltage) of the assembled battery 101 and outputs the detection result to the battery management apparatus 102. The temperature sensor 106 detects a temperature of the assembled battery 101 and outputs the detection result to the battery management apparatus 102. The relay 107 switches the connection status between the battery energy storage system 1 and the inverter 2 according to the control of the host controller 4.

The battery management apparatus 102 controls charging/discharging of the assembled battery 101 on the basis of each detection result of the current sensor 103, the cell controller 104, the voltage sensor 105, and the temperature sensor 106. The charge-discharge control of the assembled battery 101 performed by the battery management apparatus 102 includes, for example, upper limit temperature setting processing for determining an upper limit temperature $T_{limit}$ at the time of charging/discharging of the assembled battery 101, permissible current calculation processing for determining a permissible value $I_{limit}$ of the charging-discharging current of the assembled battery 101 in accordance with the upper limit temperature $T_{limit}$, and balancing control for adjusting the state of charge of each battery cell. The battery management apparatus 102 performs information communication with the host controller 4, which is required for the charge-discharge control of the assembled battery 101.

Incidentally, the battery energy storage system 1 is a system of a natural cooling method which is not equipped with a cooling apparatus such as cooling fans or a water-cooling heat sink. During charging/discharging of the assembled battery 101, the temperature of the assembled battery 101 changes due to electrochemical reactions and phase transitions in each battery cell, generation of Joule's heat, the ambient environment, and so on. A temperature change amount under this circumstance greatly depends on the charging-discharging current. Therefore, the battery energy storage system 1 determines the upper limit temperature $T_{limit}$ at the time of charging/discharging and the permissible value $I_{limit}$ of the charging-discharging current by the upper limit temperature setting processing and the permissible current calculation processing of the battery management apparatus 102 and limits the charging-discharging current in accordance with these values. Consequently, it is possible to suppress an acute temperature rise of the assembled battery 101 during charging/discharging and maintain the temperature of the assembled battery 101 to be equal to or lower than the upper limit temperature $T_{limit}$.

With a conventional control method targeted at a secondary battery system of the natural cooling method, the upper limit temperature of the battery is normally maintained as a constant value during the entire operation period of the system. However, as the secondary battery repeats charging/discharging, generally its degradation progresses, the charging capacity decreases, and the internal resistance increases. Since the increase of the internal resistance of the battery leads to an increase of a calorific value at the time of charging/discharging; and, therefore, when the upper limit temperature is constant, the permissible value of the charging-discharging current decreases as the degradation of the secondary battery progresses. As a result, as the system operation period becomes longer, the electric current and electric power which can be used at the time of charging/discharging decrease and the system utilization rate decreases.

So, this embodiment is designed to solve the above-described problems of the conventional control method by adjusting the value of the upper limit temperature $T_{limit}$ appropriately according to the degraded state of the assembled battery 101 and enhance the system utilization rate over the entire operation period. A specific method for doing so will be explained below.

Figure 2:
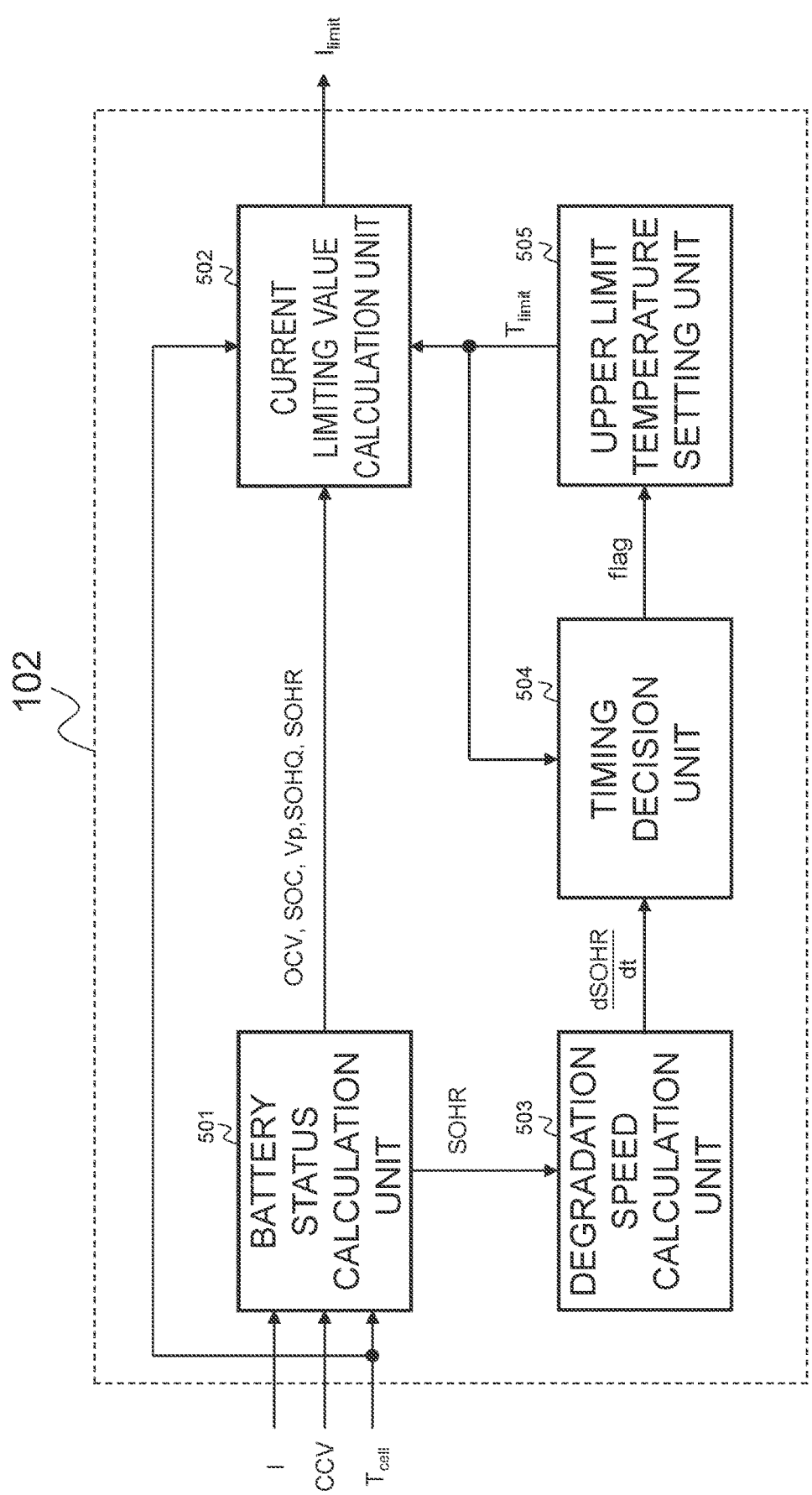
FIG. 2 is a diagram illustrating functional blocks of a battery management apparatus regarding upper limit temperature setting processing and permissible current calculation processing according to a first embodiment of the present invention.

FIG. 2 is a diagram illustrating functional blocks of the battery management apparatus 102 regarding upper limit temperature setting processing and permissible current calculation processing according to the first embodiment of the present invention. The battery management apparatus 102 in this embodiment includes the respective functional blocks of a battery status calculation unit 501, a current limiting value calculation unit 502, a degradation speed calculation unit 503, a timing decision unit 504, and an upper limit temperature setting unit 505. These functional blocks are implemented by, for example, causing a computer to execute specified programs.

The battery status calculation unit 501 acquires an electric current I, a closed circuit voltage CCV, and a battery temperature $T_{cell}$, which are detected during charging/discharging of the assembled battery 101, from the current sensor 103, the voltage sensor 105, and the temperature sensor 106, respectively. Then, the battery status calculation unit 501 calculates the respective status values of an open circuit voltage OCV, the state of charge SOC, a polarization voltage Vp, a charging capacity decrease amount SOHQ, and an internal resistance increase amount SOHR, which indicate the current status of the assembled battery 101, on the basis of the above-described information. Incidentally, the details of a method for calculating these status values to be executed by the battery status calculation unit 501 will be explained later with reference to FIG. 3.

The current limiting value calculation unit 502 acquires the respective status values of the assembled battery 101, which are calculated by the battery status calculation unit 501, and acquires the battery temperature $T_{cell}$ from the temperature sensor 106. Also, the current limiting value calculation unit 502 acquires the upper limit temperature $T_{limit}$ which is set by the upper limit temperature setting unit 505. Then, the current limiting value calculation unit 502 calculates a permissible value $I_{limit}$ of the charging-discharging current of the assembled battery 101 on the basis of these pieces of acquired information. Incidentally, regarding a method to be executed by the current limiting value calculation unit 502 for calculating the permissible value $I_{limit}$ of the charging-discharging current, various well-known calculation methods can be used and a specific explanation about them is omitted in this embodiment.

The degradation speed calculation unit 503 acquires the status value indicating the degradation degree of the assembled battery 101 among the respective status values of the assembled battery 101 calculated by the battery status calculation unit 501. Then, the degradation speed calculation unit 503 calculates the degradation speed of the assembled battery 101 on the basis of the acquired degradation degree. In this embodiment, an explanation will be provided about an example where the degradation speed calculation unit 503 acquires the internal resistance increase amount SOHR, as the status value indicating the degradation degree of the assembled battery 101, from the battery status calculation unit 501 and calculates a time derivative value dSOHR/dt of this internal resistance increase amount SOHR as the degradation speed of the assembled battery 101. Incidentally, when the upper limit temperature $T_{limit}$ is constant, as the usage time of the assembled battery 101 becomes longer, the time derivative value dSOHR/dt of the internal resistance increase amount SOHR becomes smaller as described later. The details of a method to be executed by the degradation speed calculation unit 503 for calculating the degradation speed of the assembled battery 101, that is, the time derivative value dSOHR/dt of the internal resistance increase amount SOHR will be explained later with reference to FIG. 5.

The timing decision unit 504 acquires the degradation speed dSOHR/dt of the assembled battery 101 which is calculated by the degradation speed calculation unit 503. Then, the timing decision unit 504 decides the timing to raise the upper limit temperature $T_{limit}$ of the assembled battery 101 on the basis of the acquired degradation speed dSOHR/dt and outputs a flag value which indicates the result. In this embodiment, the timing decision unit 504 acquires a value of the upper limit temperature $T_{limit}$, which is currently set, from the upper limit temperature setting unit 505 and judges whether a specified preset condition for this current upper limit temperature $T_{limit}$ is satisfied by the degradation speed dSOHR/dt or not. As a result, if the timing decision unit 504 determines that the condition is not satisfied, it decides the timing for the upper limit temperature setting unit 505 to raise the upper limit temperature $T_{limit}$ by changing the flag value which is output to the upper limit temperature setting unit 505. Incidentally, the details of a method to be executed by the timing decision unit 504 for deciding the timing to raise the upper limit temperature $T_{limit}$ will be explained later with reference to FIG. 6.

The upper limit temperature setting unit 505 sets a value of the upper limit temperature $T_{limit}$ according to the degraded state of the assembled battery 101 and outputs the set value to the current limiting value calculation unit 502. In this embodiment, the upper limit temperature setting unit 505 raises the value of the upper limit temperature $T_{limit}$ in a stepwise manner in accordance with the timing decided by the timing decision unit 504. Specifically speaking, when the flag value which is input from the timing decision unit 504 changes, the upper limit temperature setting unit 505 raises the upper limit temperature $T_{limit}$ in a stepwise manner by setting a new value of the upper limit temperature $T_{limit}$ according to the changed flag value instead of the value of the upper limit temperature $T_{limit}$ which has been used. Incidentally, the value of the upper limit temperature $T_{limit}$ for each flag value is set in advance by the upper limit temperature setting unit 505.

The permissible value limit of the charging-discharging current which is found by the battery management apparatus 102 according to the upper limit temperature $T_{limit}$ is transmitted from the battery management apparatus 102 to the host controller 4 and is used to, for example, control the inverter 2. Accordingly, the charge-discharge control of the assembled battery 101 is performed in the battery energy storage system 1 so that the battery temperature $T_{cell}$ will not exceed the upper limit temperature $T_{limit}$. Under this circumstance, the inverter 2 performs charging/discharging of the assembled battery 101 in accordance with the permissible value $I_{limit}$ of the charging-discharging current.

Figure 3:
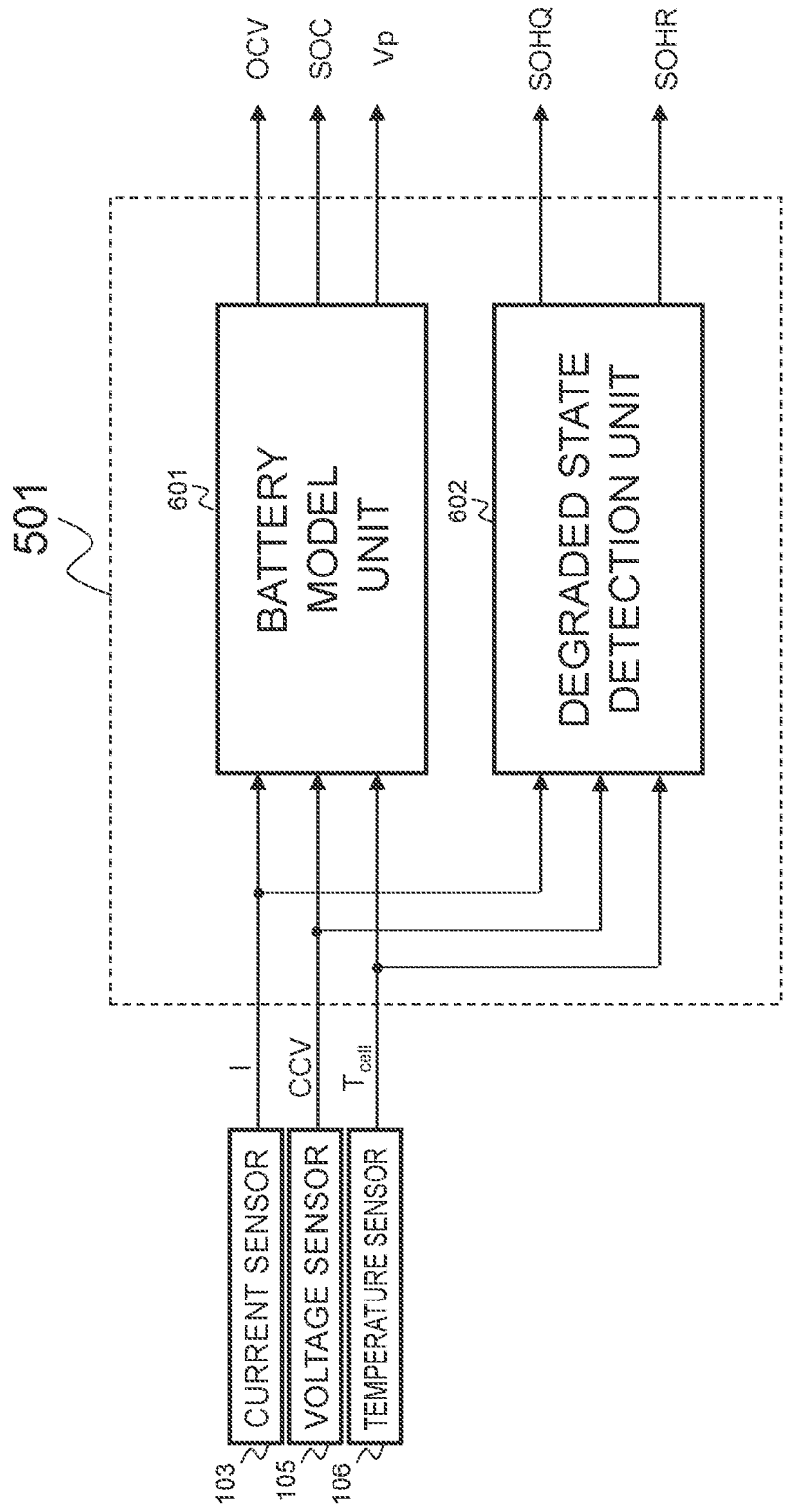
FIG. 3 is a diagram illustrating functional blocks of a battery status calculation unit.

FIG. 3 is a diagram illustrating functional blocks of the battery status calculation unit 501. The battery status calculation unit 501 includes a battery model unit 601 and a degraded state detection unit 602.

The battery model unit 601: stores a battery model which is formed as a model of the assembled battery 101; and finds the open circuit voltage OCV, the state of charge SOC, and the polarization voltage Vp by using this battery model. The battery model in the battery model unit 601 is set according to, for example, the number of series connections and the number of parallel connections of the battery cells in the actual assembled battery 101 and an equivalent circuit of each battery cell. The battery model unit 601 can find the open circuit voltage OCV, the state of charge SOC, and the polarization voltage Vp according to the status of the assembled battery 101 by applying the electric current I, the closed circuit voltage CCV, and the battery temperature $T_{cell}$, which are acquired from the current sensor 103, the voltage sensor 105, and the temperature sensor 106, respectively, to this battery model.

Figure 4:
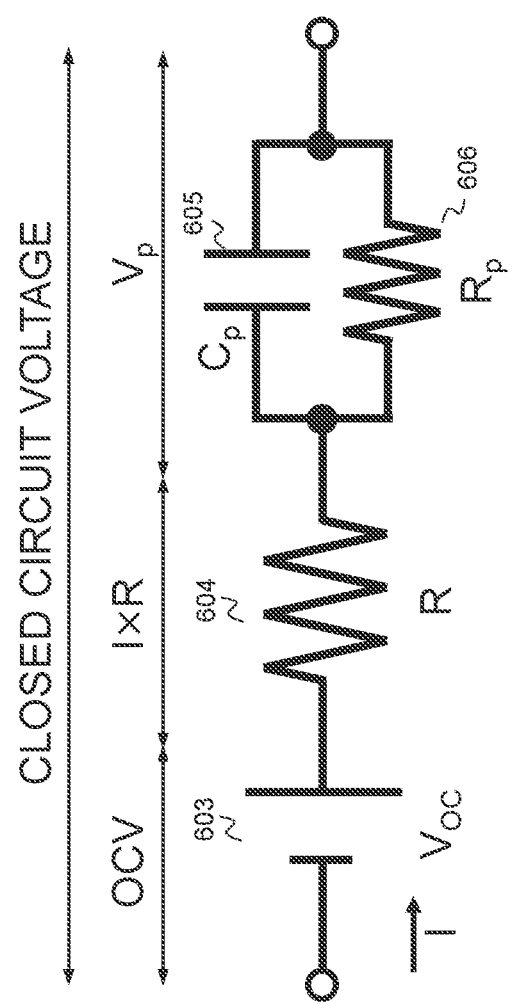
FIG. 4 is a diagram illustrating an example of an equivalent circuit for a battery cell in a battery model.

FIG. 4 is a diagram illustrating an example of an equivalent circuit for a battery cell in the battery model which is set in the battery model unit 601. The equivalent circuit for the battery cell illustrated in FIG. 4 is configured so that an open circuit voltage source 603 having a voltage value Voc, an internal resistance 604 having a resistance value R, and a parallel circuit of a polarization capacity 605 having a capacity value Cp and a polarization resistance 606 having a resistance value Rp are serially connected to each other. Regarding this equivalent circuit, a voltage across (~ ～の両端電圧) the open circuit voltage source 603, that is, a voltage value Voc corresponds to the open circuit voltage OCV; and a voltage across the parallel circuit of the polarization capacity 605 and the polarization resistance 606 corresponds to the polarization voltage Vp. Moreover, the value obtained, when the electric current I flows through this equivalent circuit, by adding an applied voltage I×R of the internal resistance 604 and the polarization voltage Vp to the open circuit voltage OCV corresponds to the closed circuit voltage CCV. Furthermore, a value of each circuit constant for the equivalent circuit in FIG. 4 is determined according to the battery temperature $T_{cell}$. Therefore, the battery model unit 601 can find the open circuit voltage OCV and the polarization voltage Vp of the entire assembled battery 101 from the electric current I, the closed circuit voltage CCV, and the battery temperature $T_{cell}$ on the basis of the relationship between these values and further find the state of charge SOC from the calculation result of the open circuit voltage OCV.

Returning back to the explanation of FIG. 3, the degraded state detection unit 602 detects the degraded state of the assembled battery 101 and finds the charging capacity decrease amount SOHQ and the internal resistance increase amount SOHR according to the degraded state. The degradation of each battery cell of the assembled battery 101 progresses by repeating charging/discharging and the charging capacity decreases and the internal resistance increases according to the state of such degradation. The degraded state detection unit 602 stores in advance, for example, information indicating the relationship between the electric current, voltage, and temperature of the assembled battery 101 and the degraded state and detects the degraded state of the assembled battery 101 on the basis of the electric current I, the closed circuit voltage CCV, and the battery temperature $T_{cell}$ which are acquired from the current sensor 103, the voltage sensor 105, and the temperature sensor 106, respectively, by using the above-described information. Then, The degraded state detection unit 602 can find the charging capacity decrease amount SOHQ and the internal resistance increase amount SOHR corresponding to the detection result of the degraded state of the assembled battery 101 on the basis of the previously stored relationship between the degraded state and the charging capacity decrease amount SOHQ and the internal resistance increase amount SOHR.

Figure 5:
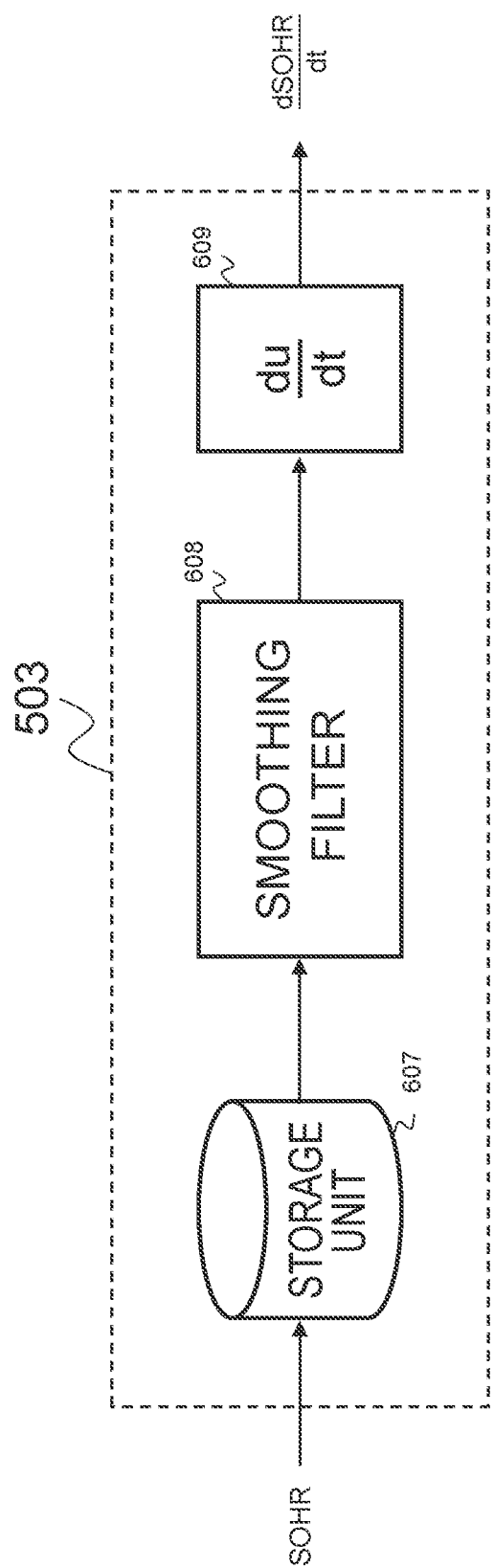
FIG. 5 is a diagram illustrating functional blocks of a degradation speed calculation unit.

FIG. 5 is a diagram illustrating functional blocks of the degradation speed calculation unit 503. The degradation speed calculation unit 503 includes a storage unit 607, a smoothing filter 608, and a differential operation unit 609.

Values of the internal resistance increase amount SOHR which are acquired from the current limiting value calculation unit 502 are recorded in the storage unit 607 in chronological order. The smoothing filter 608, for example, calculates a moving average, etc. of the internal resistance increase amount SOHR recorded in the storage unit 607, thereby removing and smoothing fluctuations included in a history of the internal resistance increase amount SOHR in a short time period. This action of the smoothing filter 608 makes it possible to recognize a tendency of the degraded state of the assembled battery 101 in a long term. The differential operation unit 609 calculates the degradation speed of the assembled battery 101 by performing an arithmetic operation of the time derivative value dSOHR/dt of the internal resistance increase amount SOHR smoothed by the smoothing filter 608.

Incidentally, calculation frequency of the degradation speed by the degradation speed calculation unit 503 is decided according to the use frequency and charging-discharging tendency of the assembled battery 101 and varies depending on the intended use of the battery energy storage system 1. For example, in a case of the battery energy storage system 1 used in hybrid automobiles, the degradation speed is calculated by the degradation speed calculation unit 503 on a weekly basis.

Figure 6:
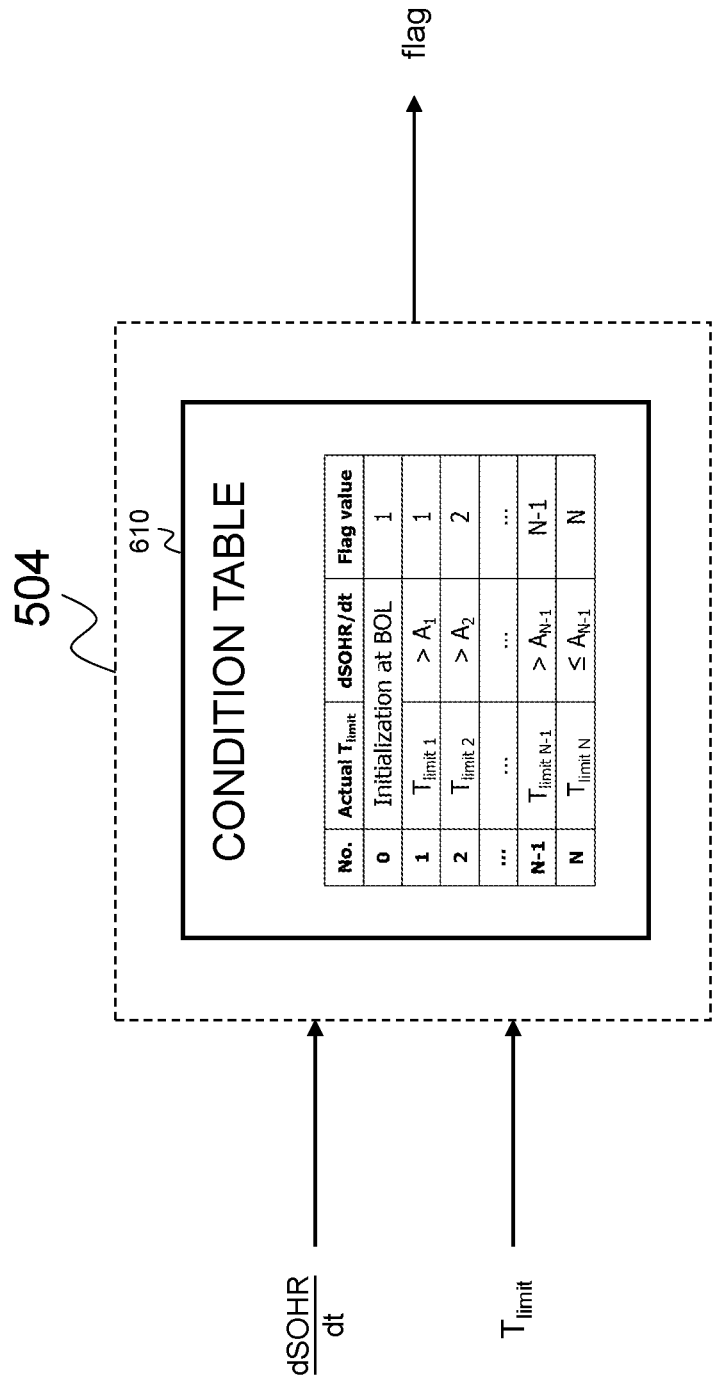
FIG. 6 is a functional block diagram of a timing decision unit.

FIG. 6 is a functional block diagram of the timing decision unit 504. The timing decision unit 504 has, for example, a condition table 610 and decides the timing to raise the upper limit temperature $T_{limit}$ on the basis of the degradation speed dSOHR/dt by using this condition table 610.

An example illustrated in FIG. 6 shows, as the condition table 610, N pieces of conditions for the degradation speed dSOHR/dt, which are set in advance to the respective upper limit temperature values $T_{limit\ 1}$ to $T_{limit\ N}$, and flag values 1 to N corresponding to the respective conditions. However, N represents an integer equal to or more than 2. Incidentally, a first row in the condition table 610 shows that an initial flag value is 1 at the beginning of life (BOL: Beginning Of Life) of the assembled battery 101. The timing decision unit 504 selects and outputs the flag value corresponding to the value of the current upper limit temperature $T_{limit}$, which is set by the upper limit temperature setting unit 505, by referring to this condition table 610. Moreover, the timing decision unit 504 acquires the condition for the degradation speed dSOHR/dt corresponding to the value of the current upper limit temperature $T_{limit}$; and if the value of the degradation speed dSOHR/dt which is input from the degradation speed calculation unit 503 no longer satisfies the relevant condition, the timing decision unit 504 outputs a flag value corresponding to the next condition. Consequently, the flag value is changed according to the degradation speed dSOHR/dt.

For example, if the flag value is 1, the value of the upper limit temperature $T_{limit}$ is set to $T_{limit\ 1}$ by the upper limit temperature setting unit 505. When this happens, the timing decision unit 504 refers to a second row of the condition table 610 and compares the degradation speed dSOHR/dt with a specified threshold value $A_1$. Then, while the degradation speed dSOHR/dt is larger than the threshold value $A_1$, the flag value is maintained as 1 without any change; and when the degradation speed dSOHR/dt becomes equal to or smaller than the threshold value $A_1$, the flag value is changed from 1 to 2. In response to this change of the flag value, the value of the upper limit temperature $T_{limit}$ which is set by the upper limit temperature setting unit 505 changes from $T_{limit\ 1}$ to $T_{limit\ 2}$ ($T_{limit\ 1} < T_{limit\ 2}$). As a result of such processing executed with respect to each of the N pieces of conditions, the value of the upper limit temperature $T_{limit}$ which is set by the upper limit temperature setting unit 505 changes from the initial value $T_{limit\ 1}$ to a final value $T_{limit\ N}$ in N steps.

Figure 7:
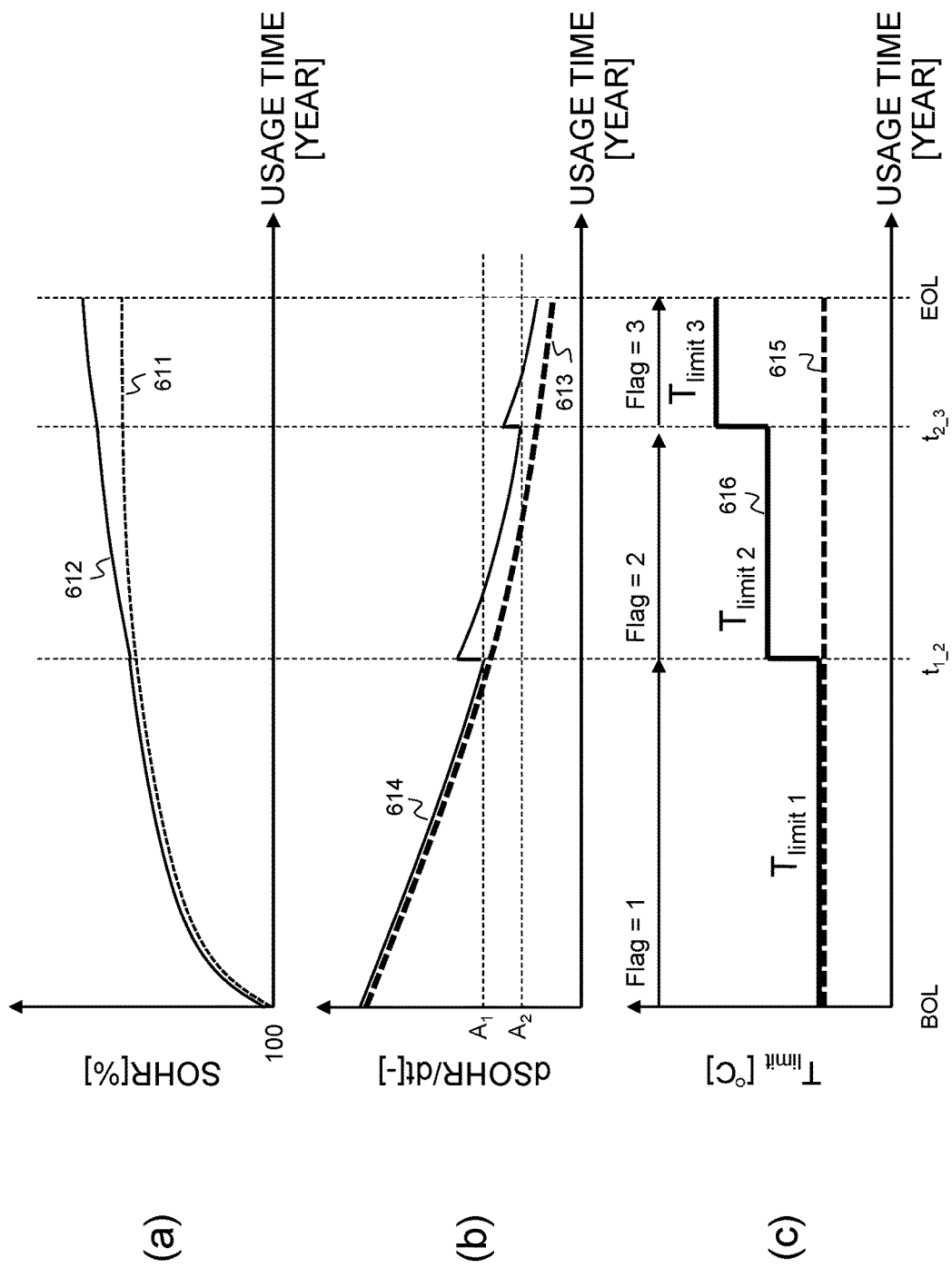
FIG. 7 is a diagram illustrating how an internal resistance increase amount, a degradation speed, and an upper limit temperature are changed by the battery management apparatus according to the first embodiment of the present invention.

FIG. 7 is a diagram illustrating how the internal resistance increase amount SOHR, the degradation speed dSOHR/dt, and the upper limit temperature $T_{limit}$ are changed by the battery management apparatus according to the first embodiment of the present invention 102. FIG. 7 shows how the internal resistance increase amount SOHR, the degradation speed dSOHR/dt, and the upper limit temperature $T_{limit}$ change in association with the usage time the battery energy storage system 1, by using graphs (a), (b), and (c), respectively, in the case where the battery management apparatus 102 according to this embodiment is applied by setting, for example, N=3 (hereinafter referred to as "at the time of the application of the present invention"). Incidentally, with each graph of FIG. 7(*a*) to FIG. 7(*c*), the case where a conventional control method of using a constant value as the upper limit temperature $T_{limit}$ and not changing it (hereinafter referred to as "at the time of the conventional control") is also indicated.

Regarding each graph of FIG. 7(*a*) and FIG. 7(*b*), a horizontal axis represents the system usage time on a yearly basis from the beginning of life (BOL) to the end of life (EOL: End Of Life) of the assembled battery 101. On the other hand, a vertical axis of FIG. 7(*a*) represents the internal resistance increase amount SOHR (%) when the initial value of the internal resistance R of the assembled battery 101 is 100%; a vertical axis of FIG. 7(*b*) represents the magnitude of the degradation speed dSOHR/dt; and a vertical axis of FIG. 7(*c*) represents the value (° C.) of the upper limit temperature $T_{limit}$. FIG. 7(*a*) shows the internal resistance increase amount SOHR at the time of the conventional control and at the time of the application of the present invention, using a broken line 611 and a solid line 612, respectively. FIG. 7(*b*) shows the degradation speed dSOHR/dt at the time of the conventional control and at the time of the application of the present invention, using a broken line 613 and a solid line 614, respectively. FIG. 7(*c*) shows the upper limit temperature $T_{limit}$ at the time of the conventional control and at the time of the application of the present invention, using a broken line 615 and a solid line 616, respectively.

At the time of the conventional control, the internal resistance increase amount SOHR gradually increases in association with the usage time of the assembled battery 101 as indicated with the broken line 611 in FIG. 7(*a*). This inclination of the broken line 611: becomes larger as the usage time is shorter; and becomes smaller as the usage time proceeds. Therefore, the degradation speed dSOHR/dt at the time of the conventional control decreases according to the usage time as indicated with the broken line 613 in FIG. 7(*b*). Incidentally, the upper limit temperature $T_{limit}$ of at the time of the conventional control does not change from the initial value $T_{limit}$ as indicated with the broken line 615 in FIG. 7(*c*).

On the other hand, at the time of the application of the present invention, when the degradation speed dSOHR/dt indicated with the solid line 614 in FIG. 7(*b*) becomes smaller than the specified threshold value $A_1$ at time $t_{1\_2}$, the flag value which is output from the timing decision unit 504 changes from 1 to 2. Therefore, as indicated with the solid line 616 in FIG. 7(*c*), the upper limit temperature $T_{limit}$ changes from $T_{limit\ 1}$ to a higher temperature $T_{limit\ 2}$ at time $t_{1\_2}$ by means of the processing of the upper limit temperature setting unit 505. As a result, as indicated with the solid lines 612, 614 in FIG. 7(*a*) and FIG. 7(*b*), respectively, the tendency of the internal resistance increase amount SOHR and that of the degradation speed dSOHR/dt change before time $t_{1\_2}$ and after time $t_{1\_2}$, respectively. Subsequently, while the degradation speed dSOHR/dt exceeds a specified threshold value $A_2$, the flag value which is output from the timing decision unit 504 is maintained as 2.

When the degradation speed dSOHR/dt indicated with the solid line 614 in FIG. 7(*b*) becomes lower than the threshold value $A_2$ at time $t_{2\_3}$, the flag value which is output from the timing decision unit 504 changes from 2 to 3. Therefore, as indicated with the solid line 616 in FIG. 7(*c*), the upper limit temperature $T_{limit}$ changes from $T_{limit\ 2}$ to a higher temperature $T_{limit\ 3}$ at time $t_{2\_3}$ by means of the processing of the upper limit temperature setting unit 505. Again this time similarly to time $t_{1\_2}$, the tendency of the internal resistance increase amount SOHR and that of the degradation speed dSOHR/dt change before time $t_{2\_3}$ and after time $t_{2\_3}$, respectively. Subsequently, the upper limit temperature $T_{limit}$ is maintained at $T_{limit\ 3}$ until the end of life (EOL) of the assembled battery 101.

The battery management apparatus 102 according to this embodiment can raise the upper limit temperature $T_{limit}$ in a stepwise manner in association with the decrease of the degradation speed dSOHR/dt by means of the above-described processing.

Figure 8:
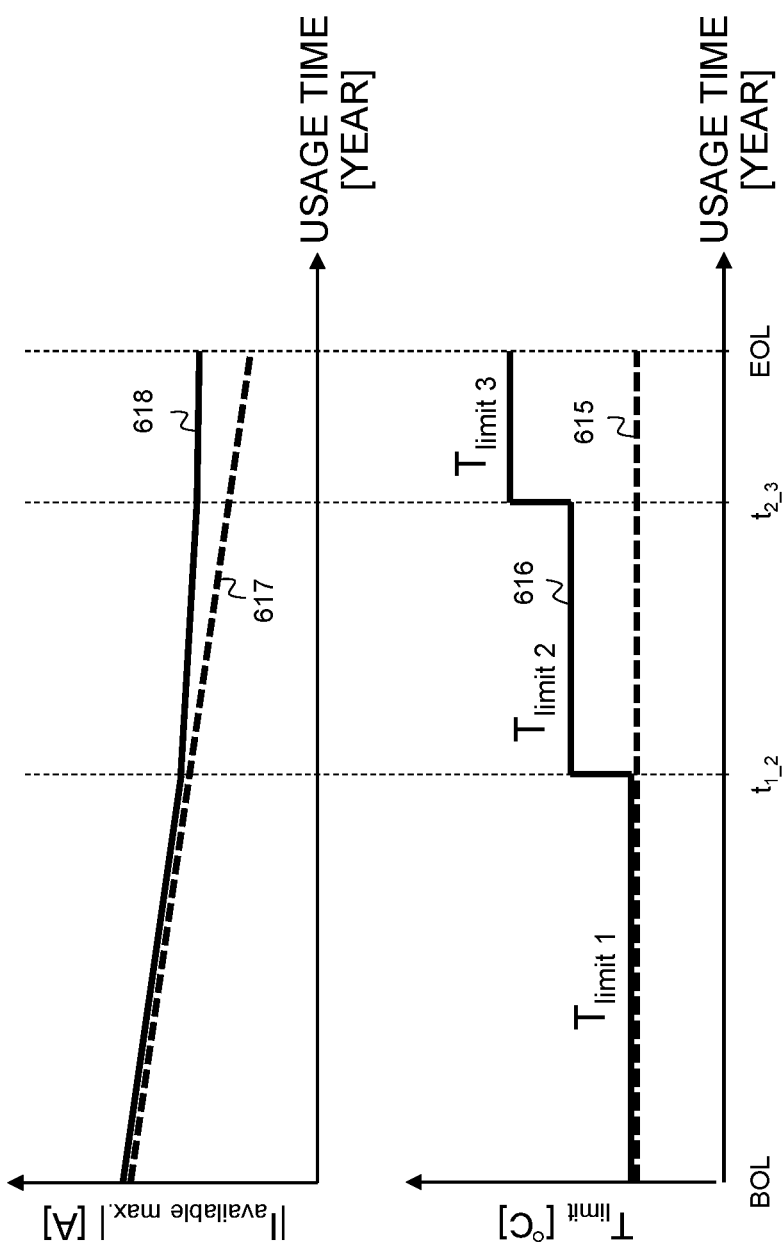
FIG. 8 is a diagram for explaining the effects by the battery management apparatus according to the first embodiment of the present invention.

FIG. 8 is a diagram illustrating the effects of the battery management apparatus according to the first embodiment of the present invention 102. FIG. 8(*a*) shows how a maximum value $I_{available\ max}$ of an available charging-discharging current changes at the time of the application of the present invention and at the time of the conventional control, respectively. A horizontal axis of FIG. 8(*a*), similarly to each graph in FIG. 7, represents the system usage time of the assembled battery 101 on a yearly basis from the beginning of life (BOL) to the end of life (EOL). On the other hand, a vertical axis of FIG. 8(*a*) represents an absolute value of the maximum value $I_{available\ max}$ of the charging-discharging current. FIG. 8(*a*) shows the absolute value of the maximum value $I_{available\ max}$ of the charging-discharging current at the time of the conventional control and at the time of the application of the present invention, using a broken line 617 and a solid line 618, respectively. Incidentally, the maximum value $I_{available\ max}$ of the charging-discharging current corresponds to the permissible value Mimic of the charging-discharging current which is calculated by the current limiting value calculation unit 502 according to the upper limit temperature $T_{limit}$. Moreover, FIG. 8(*b*) shows how the upper limit temperature $T_{limit}$ changes and this is the same as what is illustrated in FIG. 7(*c*).

At the time of the conventional control, as indicated with the broken line 615 in FIG. 8(*b*), the upper limit temperature $T_{limit}$ stays at the initial value $T_{limit\ 1}$ and does not change. Therefore, the internal resistance R of the assembled battery 101 continues to increase along with the elapse of time and the calorific value of the assembled battery 101 at the time of charging/discharging continues to increase accordingly. Therefore, as indicated with the broken line 617 in FIG. 8(a), the absolute value of the maximum value $I_{available\_max}$ of the charging-discharging current decreases as the usage time of the assembled battery 101 proceeds.

On the other hand, at the time of the application of the present invention, the upper limit temperature Tint rises in a stepwise manner at time $t_{1\_2}$ and time $t_{2\_3}$ as indicated with the solid line 616 in FIG. 8(b). Therefore, as compared to at the time of the conventional control, the absolute value of the maximum value $I_{available\_max}$ of the charging-discharging current becomes larger at and after time $t_{1\_2}$ as indicated with the solid line 618 in FIG. 8(a). Incidentally, the difference from at the time of the conventional control becomes even larger at and after time $t_{2\_3}$.

The battery management apparatus 102 according to this embodiment raises the upper limit temperature $T_{limit}$ in a stepwise manner in association with the decrease of the degradation speed dSOHR/dt as explained above, so that it is possible to make the absolute value of the maximum value $I_{available\_max}$ of the charging-discharging current larger than that at the time of the conventional control. Therefore, the utilization rate of the battery energy storage system 1 can be increased. As a result, for example, when the battery management apparatus 102 according to this embodiment is applied to hybrid automobiles, it is possible to reduce fuel consumption significantly.

The above-described first embodiment of the present invention can bring about the following operational advantages.

(1) The battery management apparatus 102 is an apparatus for managing the chargeable-dischargeable assembled battery 101 and includes: the battery status calculation unit 501 that calculates the internal resistance increase amount SOHR indicating the degradation degree of the assembled battery 101; the degradation speed calculation unit 503 that calculates the degradation speed dSOHR/dt of the assembled battery 101 on the basis of the internal resistance increase amount SOHR; and the upper limit temperature setting unit 505 that sets the upper limit temperature $T_{limit}$ of the assembled battery 101 on the basis of the degradation speed dSOHR/dt. The upper limit temperature setting unit 505 raises the upper limit temperature $T_{limit}$ in association with the decrease of the degradation speed dSOHR/dt. Consequently, the upper limit temperature $T_{limit}$ of the assembled battery 101 can be adjusted appropriately according to the degraded state of the assembled battery 101.

(2) The battery management apparatus 102 includes the timing decision unit 504 that decides the timing to raise the upper limit temperature $T_{limit}$ on the basis of the degradation speed dSOHR/dt. The upper limit temperature setting unit 505 raises the upper limit temperature $T_{limit}$ in a stepwise manner according to the timing decided by the timing decision unit 504. Consequently, the upper limit temperature $T_{limit}$ can be raised at the appropriate timing according to the degradation speed dSOHR/dt.

(3) The timing decision unit 504 decides the timing to raise the upper limit temperature $T_{limit}$ on the basis of the degradation speed dSOHR/dt and the current upper limit temperature Tint. Consequently, it is possible to appropriately decide the timing to raise the upper limit temperature $T_{limit}$ in a stepwise manner.

(4) The timing decision unit 504 compares the degradation speed dSOHR/dt with the degradation speed condition which is set for each value of the upper limit temperature $T_{limit}$ by using, for example, the condition table 610 as illustrated in FIG. 6 and decides the timing to raise the upper limit temperature $T_{limit}$ on the basis of the comparison result. Consequently, it is possible to easily decide the timing to raise the upper limit temperature $T_{limit}$.

Second Embodiment

Next, a second embodiment of the present invention will be explained. In this embodiment, another aspect of the upper limit temperature setting processing executed by the battery management apparatus 102 will be explained. Incidentally, the configuration of a battery energy storage system according to this embodiment is similar to that of the battery energy storage system (BESS) 1 explained in the first embodiment, so that an explanation about it is omitted.

Figure 9:
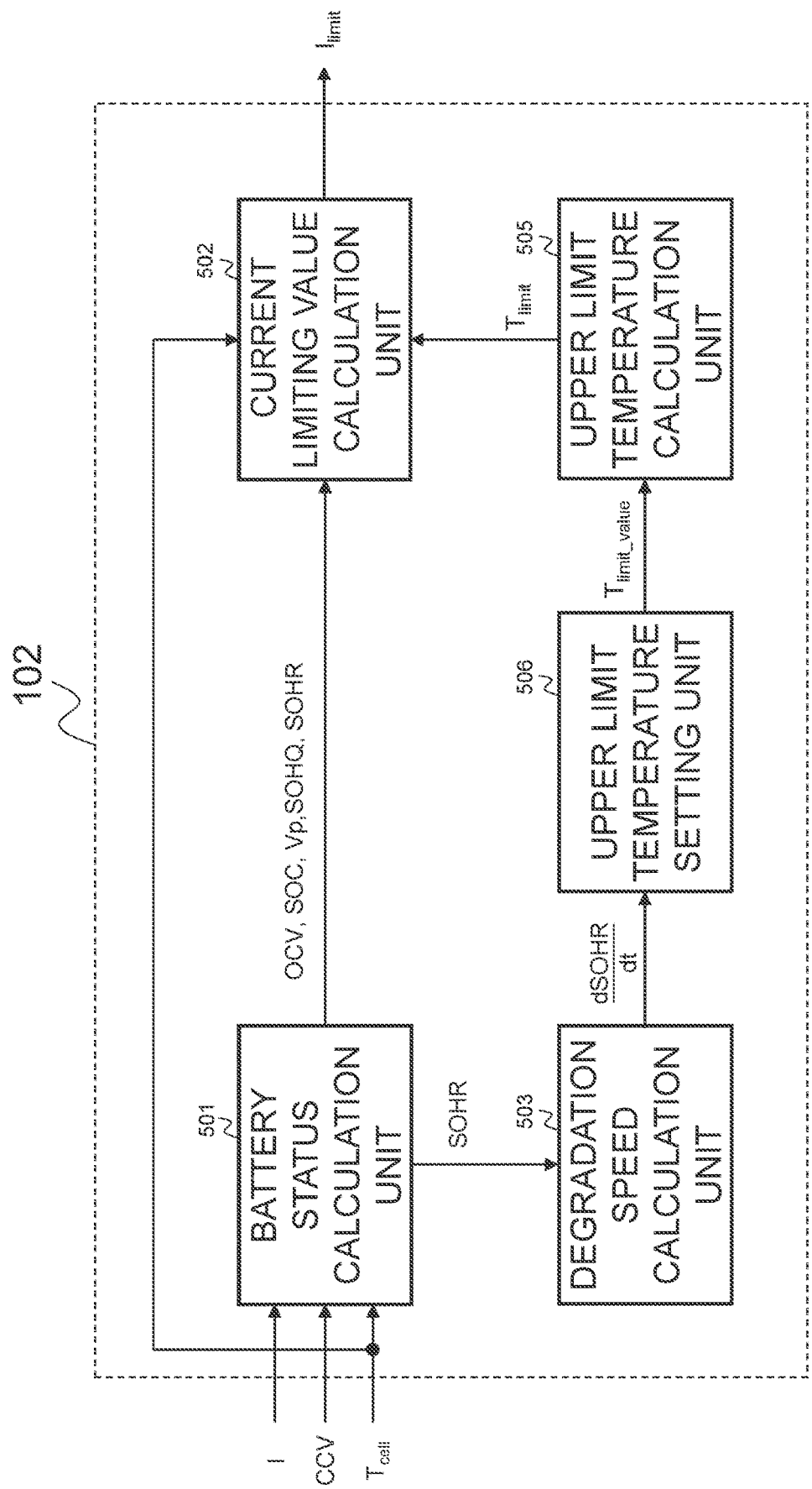
FIG. 9 is a diagram illustrating functional blocks of a battery management apparatus regarding upper limit temperature setting processing and permissible current calculation processing according to a second embodiment of the present invention.

FIG. 9 is a diagram illustrating functional blocks of the battery management apparatus 102 regarding the upper limit temperature setting processing and the permissible current calculation processing according to the second embodiment of the present invention. The battery management apparatus 102 according to this embodiment includes the respective functional blocks of a battery status calculation unit 501, a current limiting value calculation unit 502, a degradation speed calculation unit 503, an upper limit temperature calculation unit 506, and an upper limit temperature setting unit 505. These functional blocks are implemented by, for example, causing a computer to execute specified programs.

The battery status calculation unit 501, the current limiting value calculation unit 502, and the degradation speed calculation unit 503 in FIG. 9 are respectively similar to those in the battery management apparatus 102 in FIG. 2 which are explained in the first embodiment. Therefore, an explanation will be provided below mainly about actions of the upper limit temperature calculation unit 506 in FIG. 9, which is provided instead of the timing decision unit 504 in FIG. 2, and the upper limit temperature setting unit 505 corresponding to the upper limit temperature calculation unit 506 and an explanation about other functional blocks in FIG. 9 is omitted.

The upper limit temperature calculation unit 506 acquires the degradation speed dSOHR/dt of the assembled battery 101 which is calculated by the degradation speed calculation unit 503. Then, the upper limit temperature calculation unit 506 calculates the upper limit temperature value $T_{limit\_value}$ indicating a set value for the upper limit temperature $T_{limit}$ of the assembled battery 101 on the basis of the acquired degradation speed dSOHR/dt and outputs it to the upper limit temperature setting unit 505. The upper limit temperature setting unit 505 continuously changes the value of the upper limit temperature $T_{limit}$ on the basis of this upper limit temperature value $T_{limit\_value}$.

The upper limit temperature calculation unit 506 directly calculates the upper limit temperature value $T_{limit\_value}(t)$ at time t from the degradation speed dSOHR/dt by using, for example, a function indicated as Expression (1).

$$T_{limit\_value}(t) = f(x_1(t), \ldots, x_p(t)) \quad (1)$$

Regarding the function of Expression (1), an argument $x_1(t), \ldots, x_p(t)$ represents each piece of degradation speed information of the assembled battery 101. In this embodiment, it is assumed that there is one argument; and an explanation will be provided about an example where the time derivative value dSOHR/dt of the internal resistance increase amount SOHR which is calculated as the degradation speed of the assembled battery 101 corresponds to this argument. Incidentally, the number of the argument(s) in Expression (1) is not limited to one and can be set to any arbitrary number. Moreover, the function expressed with Expression (1) has such a characteristic that as the value of the argument becomes smaller, that is, as the degradation of the assembled battery 101 progresses and the degradation speed thereby decreases more, the value of the upper limit temperature value $T_{limit\_value}(t)$ becomes larger. This function which, for example, is preset based on various kinds of experimental data or the like acquired under various temperature conditions is stored in the upper limit temperature calculation unit 506.

Figure 10:
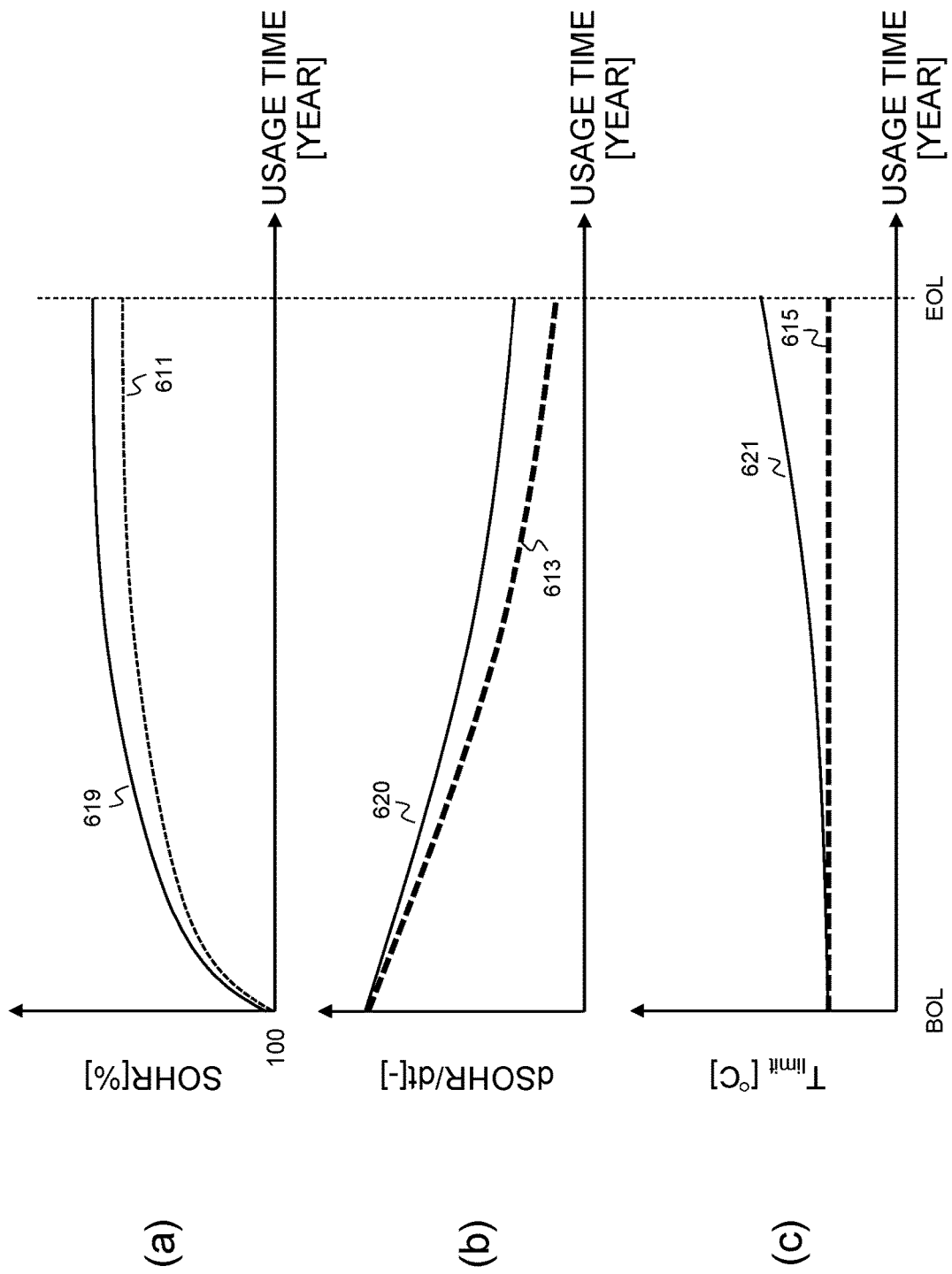
FIG. 10 illustrates how the internal resistance increase amount, the degradation speed, and the upper limit temperature are changed by a battery management apparatus according to the second embodiment of the present invention.

FIG. 10 is a diagram illustrating how the internal resistance increase amount SOHR, the degradation speed dSOHR/dt, and the upper limit temperature $T_{limit}$ are changed by the battery management apparatus 102 according to the second embodiment of the present invention. FIG. 10 shows how the internal resistance increase amount SOHR, the degradation speed dSOHR/dt, and the upper limit temperature $T_{limit}$ change in association with the usage time of the battery energy storage system 1, by using graphs (a), (b), and (c), respectively, in the case where the battery management apparatus 102 according to this embodiment is applied (hereinafter referred to as "at the time of the application of the present invention"). Incidentally, with each graph of FIG. 10(a) to FIG. 10(c), the case at the time of the conventional control where the upper limit temperature $T_{limit}$ is a constant value and will not be changed is also indicated as a comparative example in the same manner as with each graph of FIG. 7(a) to FIG. 7(c) explained in the first embodiment.

A horizontal axis and a vertical axis of each graph in FIG. 10(a) to FIG. 10(c) are similar to those of each graph in FIG. 7(a) to FIG. 7(c) explained in the first embodiment. FIG. 10(a) shows the internal resistance increase amount SOHR at the time of the conventional control and at the time of the application of the present invention, using a broken line 611 and a solid line 619, respectively. FIG. 10(b) shows the degradation speed dSOHR/dt at the time of the conventional control and at the time of the application of the present invention, using a broken line 613 and a solid line 620, respectively. FIG. 10(c) shows the upper limit temperature $T_{limit}$ at the time of the conventional control and at the time of the application of the present invention, using a broken line 615 and a solid line 621, respectively.

At the time of the application of the present invention, as the degradation speed dSOHR/dt indicated with the solid line 620 in FIG. 10(b) decreases along with the elapse of the usage time, the upper limit temperature $T_{limit}$ continuously increases as indicated with the solid line 621 in FIG. 10(c). Specifically speaking, the upper limit temperature $T_{limit}$ continuously changes according to the upper limit temperature value $T_{limit\_value}$ calculated by using the function of Expression (1) having the aforementioned characteristic in such a manner that as the degradation speed dSOHR/dt becomes lower, the upper limit temperature $T_{limit}$ becomes higher. As a result, the differences in the internal resistance increase amount SOHR and the degradation speed dSOHR/dt from those at the time of the conventional control become larger as indicated with the solid lines 619, 620 in FIG. 10(a) and FIG. 10(b), respectively, as the usage time proceeds.

The battery management apparatus 102 according to this embodiment can continuously raise the upper limit temperature Tint in association with the decrease of the degradation speed dSOHR/dt by means of the above-described processing.

Figure 11:
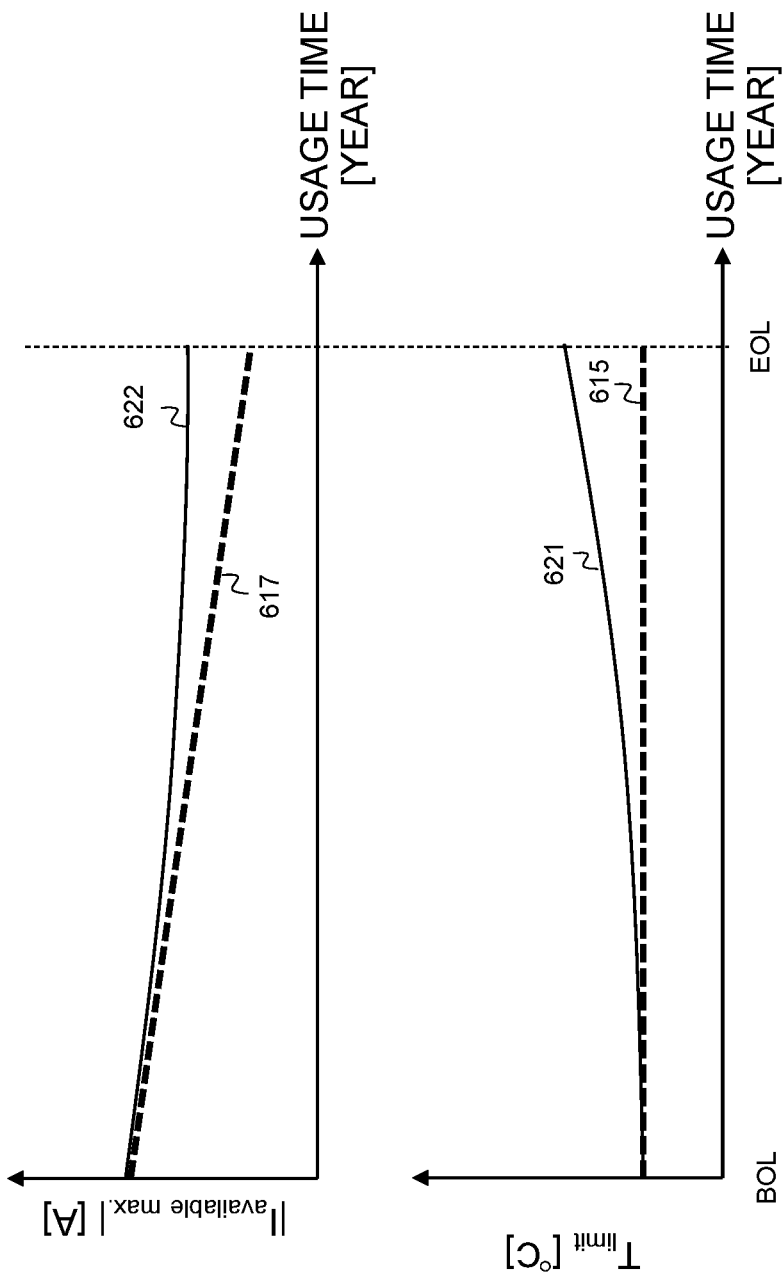
FIG. 11 is a diagram for explaining the effects by the battery management apparatus according to the second embodiment of the present invention.

FIG. 11 is a diagram for explaining the effects by the battery management apparatus according to the second embodiment of the present invention 102. FIG. 11(a) shows how the maximum value $I_{available\ max}$ of the available charging-discharging current changes at the time of the application of the present invention and at the time of the conventional control, respectively. A horizontal axis and a vertical axis of each graph in FIG. 11(a) and FIG. 11(b) are similar to those of each graph in FIG. 8(a) and FIG. 8(b) explained in the first embodiment. FIG. 11(a) shows an absolute value of the maximum value $I_{available\ max}$ of the charging-discharging current at the time of the conventional control and at the time of the application of the present invention, using a broken line 617 and solid line 622, respectively. Furthermore, FIG. 11(b) shows how the upper limit temperature $T_{limit}$ changes and this is the same as what is indicated in FIG. 10(c).

At the time of the application of the present invention, the upper limit temperature $T_{limit}$ continuously rises along with the elapse of the usage time as indicated with the solid line 621 in FIG. 11(b). Therefore, as indicated with the solid line 622 in FIG. 11(a), the absolute value of the maximum value $I_{available\ max}$ of the charging-discharging current gradually becomes larger as compared to that at the time of the conventional control.

The battery management apparatus 102 according to this embodiment can make the absolute value of the maximum value $I_{available\ max}$ of the charging-discharging current larger than that at the time of the conventional control by continuously raising the upper limit temperature $T_{limit}$ in association with the decrease of the degradation speed dSOHR/dt as explained above. Therefore, the utilization rate of the battery energy storage system 1 can be raised. As a result, for example, if the battery management apparatus 102 according to this embodiment is applied to hybrid automobiles, it is possible to reduce the fuel consumption significantly.

The above-described second embodiment of the present invention can bring about the following operational advantages in addition to the operational advantage (1) explained in the first embodiment.

(5) The battery management apparatus 102 includes the upper limit temperature calculation unit 506 that calculates the upper limit temperature value $T_{limit\_value}$ indicating the value of the upper limit temperature $T_{limit}$ on the basis of the degradation speed dSOHR/dt. The upper limit temperature setting unit 505 raises the upper limit temperature $T_{limit}$ on the basis of the upper limit temperature value $T_{limit\_value}$ calculated by the upper limit temperature calculation unit 506. Consequently, the upper limit temperature $T_{limit}$ can be raised continuously according to the degradation speed dSOHR/dt.

(6) The upper limit temperature calculation unit 506 calculates the upper limit temperature value $T_{limit\_value}$ by using the preset function of Expression (1) mentioned earlier. Consequently, the upper limit temperature value $T_{limit\_value}$ which is appropriate can be easily calculated.

(Variation)

Incidentally, the above-described first and second embodiments have described the example where the degradation speed calculation unit 503 calculates only the time derivative value dSOHR/dt of the internal resistance increase amount SOHR as the degradation speed of the assembled battery 101; however, other degradation speed information may be calculated as the degradation speed of the assembled battery 101. For example, in addition to the time derivative value dSOHR/dt of the internal resistance increase amount SOHR, a time derivative value dSOHQ/dt of the charging capacity decrease amount SOHQ can be calculated as the degradation speed of the assembled battery 101.

Figure 12:
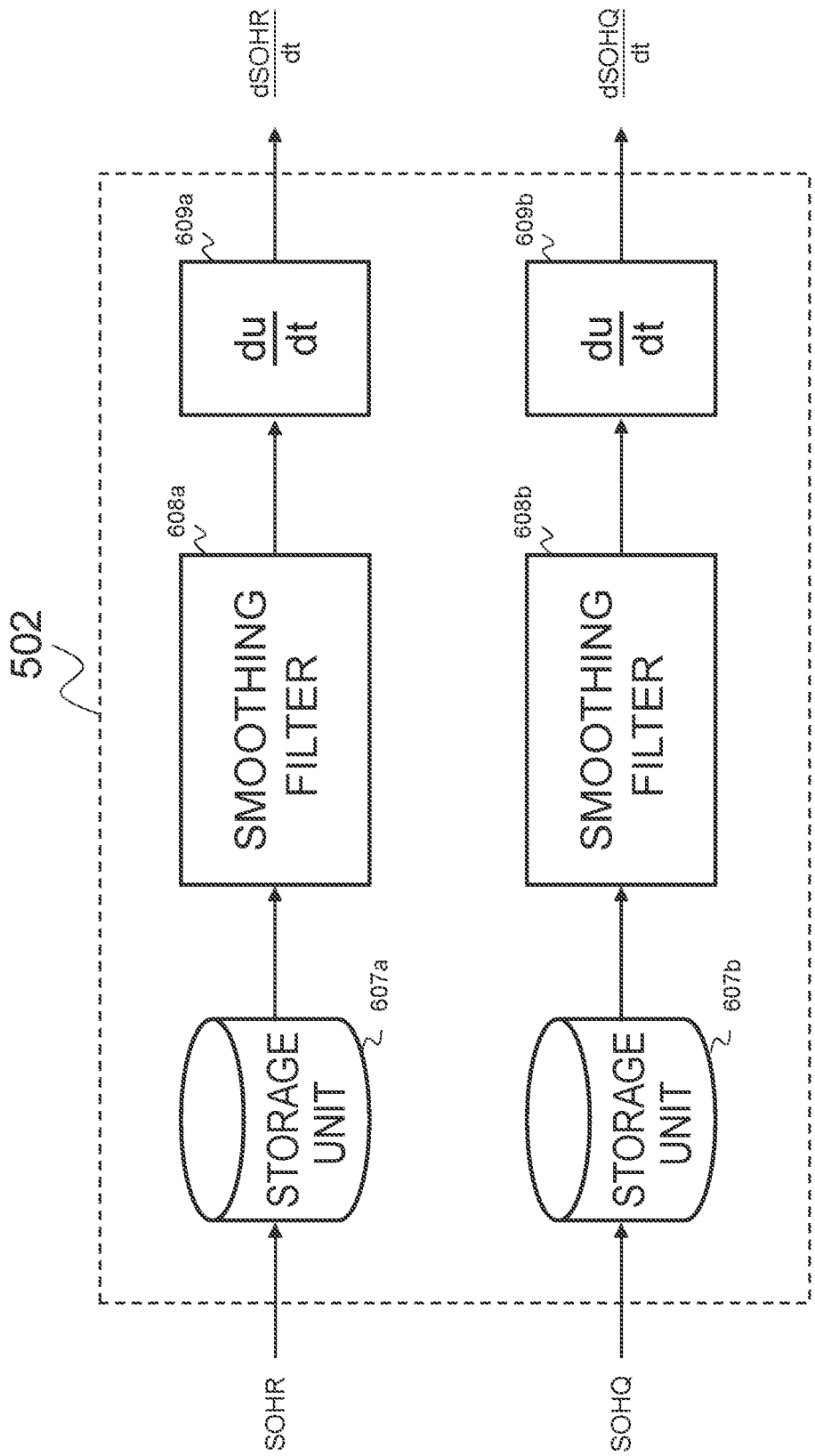
FIG. 12 is a diagram illustrating functional blocks of a degradation speed calculation unit according to a variation.

FIG. 12 is a diagram illustrating functional blocks of the degradation speed calculation unit 503 according to a variation. The degradation speed calculation unit 503 includes: a storage unit 607a, a smoothing filter 608a, and a differential operation unit 609a associated with the internal resistance increase amount SOHR; and a storage unit 607b, a smoothing filter 608b, and a differential operation unit 609b associated with the charging capacity decrease amount SOHQ.

Referring to FIG. 12, the storage unit 607a, the smoothing filter 608a, and the differential operation unit 609a respectively execute processing similar to that explained with reference to FIG. 5 with respect to the internal resistance increase amount SOHR acquired from the current limiting value calculation unit 502. Consequently, the time derivative value dSOHR/dt of the internal resistance increase amount SOHR is calculated as one piece of degradation speed information of the assembled battery 101. Furthermore, the storage unit 607b, the smoothing filter 608b, and the differential operation unit 609b respectively execute processing similar to the processing of the storage unit 607a, the smoothing filter 608a and the differential operation unit 609a with respect to the charging capacity decrease amount SOHQ acquired from the current limiting value calculation unit 502. Consequently, the time derivative value dSOHQ/dt of the charging capacity decrease amount SOHQ is calculated as one piece of the degradation speed information of the assembled battery 101.

When the above-described variation is applied to the first embodiment, the timing decision unit 504 decides the timing to raise the upper limit temperature $T_{limit}$ on the basis of the degradation speeds dSOHR/dt, dSOHQ/dt respectively calculated by the degradation speed calculation unit 503. In this case, conditions for the degradation speed dSOHQ/dt are further set to the condition table 610 illustrated in FIG. 6 in addition to the aforementioned conditions for the degradation speed dSOHR/dt. Then, whether each of the conditions for the degradation speeds dSOHR/dt, dSOHQ/dt is satisfied or not is judged; and the flag value is changed according to the judgment result, thereby changing the value of the upper limit temperature $T_{limit}$, which is set by the upper limit temperature setting unit 505, in a stepwise manner.

Furthermore, when the aforementioned variation is applied to the second embodiment, the upper limit temperature calculation unit 506 calculates the upper limit temperature value $T_{limit\_value}$ on the basis of the degradation speeds dSOHR/dt, dSOHQ/dt respectively calculated by the degradation speed calculation unit 503. In this case, the degradation speeds dSOHR/dt, dSOHQ/dt are respectively used as the argument of the function expressed in the aforementioned Expression (1) and the upper limit temperature value $T_{limit\_value}(t)$ at time t is thereby directly calculated from the degradation speeds dSOHR/dt, dSOHQ/dt and the value of the upper limit temperature $T_{limit}$ which is set by the upper limit temperature setting unit 505 is continuously changed.

Incidentally, the aforementioned variation has described the example where, in addition to the time derivative value dSOHR/dt of the internal resistance increase amount SOHR, the time derivative value dSOHQ/dt of the charging capacity decrease amount SOHQ is used as the degradation speed information of the assembled battery 101; however, another degradation speed information may be further used. Furthermore, the degradation speed information in which the plurality of kinds of degradation speed information are integrated may be calculated by setting a weighting coefficient to each of such plurality of kinds of the degradation speed information and weight-adding them; and the value of the upper limit temperature $T_{limit}$ may be changed by using such degradation speed information.

The above-described variation of the present invention further brings about the following operational advantages in addition to the operational advantages (1) to (6) explained in the first and second embodiments.

(7) The battery status calculation unit 501 calculates a plurality of kinds of degradation degrees of the assembled battery 101 (the charging capacity decrease amount SOHQ and the internal resistance increase amount SOHR). The degradation speed calculation unit 503 calculates the degradation speed for each of the plurality of kinds of the degradation degrees calculated by the battery status calculation unit 501 (the time derivative value dSOHR/dt of the internal resistance increase amount SOHR and the time derivative value dSOHQ/dt of the charging capacity decrease amount SOHQ). The upper limit temperature setting unit 505 sets the upper limit temperature $T_{limit}$ by using the plurality of kinds of the degradation speeds dSOHR/dt, dSOHQ/dt calculated by the degradation speed calculation unit 503. Consequently, the upper limit temperature $T_{limit}$ can be changed by reflecting the degraded state of the assembled battery 101 in more detail.

(8) The above-described plurality of kinds of the degradation degrees can include at least the internal resistance increase amount SOHR of the assembled battery 101 and the charging capacity decrease amount SOHQ of the assembled battery 101. Consequently, it is possible to make the degradation degree(s) represent the degraded state of the assembled battery 101 appropriately.

Incidentally, regarding the aforementioned embodiments, an explanation has been provided about application examples of the battery energy storage system of the natural cooling method; however, the present invention can be applied in the same manner to a battery energy storage system of a forced cooling method for cooling the assembled battery 101 by using a cooling apparatus such as cooling fans or a water-cooling heat sink.

The above-described embodiments and various kinds of variations are merely examples and the present invention is not limited to the content of such embodiments or variations unless they impair the features of the invention. For example, the upper limit temperature $T_{limit}$ may be adjusted according to the degradation speed of the assembled battery 101 by combining the stepwise changes of the upper limit temperature $T_{limit}$ as explained in the first embodiment and the continuous changes of the upper limit temperature $T_{limit}$ as explained in the second embodiment. Furthermore, in the second embodiment, the upper limit temperature $T_{limit}$ may be adjusted according to the degradation speed of the assembled battery 101 by: maintaining the upper limit temperature $T_{limit}$ as a constant value until the degradation speed becomes a specified degradation speed; and then calculating the upper limit temperature value $T_{limit\_value}$ by using the function like Expression (1).

Furthermore, the upper limit temperature $T_{limit}$ may be adjusted by using information indirectly indicating the degradation speed of the assembled battery 101 as the degradation speed information instead of information which directly indicates the degradation speed of the assembled battery 101 such as the time derivative value dSOHR/dt of the internal resistance increase amount SOHR and the time derivative value dSOHQ/dt of the charging capacity decrease amount SOHQ. For example, a total value of electric energy of the assembled battery 101 which has been output, a total travel distance and total parking time of a vehicle (in a case of a battery energy storage system mounted in the vehicle), total provision time of an ancillary service (in a case of a battery energy storage system connected to an electric power grid), and so on can be used as the degradation speed information of the assembled battery 101. Incidentally, in that case, appropriate conditions and functions will be required depending on the type of the degradation speed information.

The present invention is not limited to the aforementioned embodiments or variations, and can be changed in various manners within the scope not departing from the gist of the present invention.

The disclosure content of the following basic priority application is incorporated herein by reference: Japanese Patent Application No. 2018-142467 (filed on Jul. 30, 2018).

REFERENCE SIGNS LIST

1: battery energy storage system (BESS)
2: inverter
3: load
4: host controller
101: assembled battery
102: battery management apparatus
103: current sensor
104: cell controller
105: voltage sensor
106: temperature sensor
107: relay
501: battery status calculation unit
502: current limiting value calculation unit
503: degradation speed calculation unit
504: timing decision unit
505: upper limit temperature setting unit
506: upper limit temperature calculation unit
601: battery model unit
602: degraded state detection unit
603: open circuit voltage source
604: internal resistance
605: polarization capacity
606: polarization resistance
607: storage unit
608: smoothing filter
609: differential operation unit
610: condition table

The invention claimed is:

1. A battery management apparatus for managing a chargeable-dischargeable battery,
the battery management apparatus comprising:
a battery status calculation unit that calculates a degradation degree of the battery;
a degradation speed calculation unit that calculates a degradation speed of the battery on the basis of the degradation degree;
an upper limit temperature setting unit that sets an upper limit temperature of the battery on the basis of the degradation speed; and
a timing decision unit that decides timing to raise the upper limit temperature on the basis of the degradation speed,
wherein the battery status calculation unit calculates an internal resistance increase amount of the battery as the degradation degree;
wherein the degradation speed calculation unit calculates a time derivative value of the internal resistance increase amount of the battery as the degradation speed;
wherein the timing decision unit compares the degradation speed with a degradation speed condition, determines a flag indicative of the timing on the basis of a result of the comparison, and outputs the flag to the upper limit temperature setting unit;
wherein the upper limit temperature setting unit raises the upper limit temperature in a stepwise manner in accordance with the received flag; and
wherein the degradation speed condition is set to correspond to the upper limit temperature or the raised upper limit temperature as applicable when the degradation speed condition is set.

2. The battery management apparatus according to claim 1,
wherein the timing decision unit decides the timing on the basis of the degradation speed and the upper limit temperature at present.

3. The battery management apparatus according to claim 1,
comprising an upper limit temperature calculation unit that calculates a value of the upper limit temperature on the basis of the degradation speed,
wherein the upper limit temperature setting unit raises the upper limit temperature on the basis of the value of the upper limit temperature calculated by the upper limit temperature calculation unit.

4. The battery management apparatus according to claim 3,
wherein the upper limit temperature calculation unit calculates the value of the upper limit temperature by using a preset function.

5. The battery management apparatus according to claim 1,
wherein the battery status calculation unit calculates a plurality of types of degradation degrees of the battery;
wherein the degradation speed calculation unit calculates the degradation speed regarding each of the plurality of types of the degradation degrees calculated by the battery status calculation unit; and
wherein the upper limit temperature setting unit sets the upper limit temperature by using a plurality of types of the degradation speeds calculated by the degradation speed calculation unit.

6. The battery management apparatus according to claim 5,
wherein the plurality of types of the degradation degrees at least include an internal resistance increase amount of the battery and a charging capacity decrease amount of the battery.

7. A battery energy storage system comprising:
the battery management apparatus stated in claim 1;
a chargeable-dischargeable battery; and
a charging-discharging apparatus that performs charging and discharging of the battery on the basis of a permissible value of a charging-discharging current of the battery which is set in accordance with an upper limit temperature of the battery which is raised by the battery management apparatus.

8. A method for managing a chargeable-dischargeable battery,
the method executed by a computer to:
calculate an internal resistance increase amount of the battery as a degradation degree of the battery, calculate a time derivative value of the internal resistance increase amount as a degradation speed of the battery on the basis of the calculated degradation degree, set an upper limit temperature of the battery on the basis of the calculated degradation speed to raise the upper limit temperature in association with a decrease of the degradation speed, decide a timing to raise the upper limit temperature on the basis of the degradation speed compare the degradation speed with a degradation speed condition corresponding to the upper limit temperature, determine a flag indicative of the timing on the basis of a result of the comparison, output the flag to the upper limit temperature setting unit, and raise the upper limit temperature in a stepwise manner in accordance with the received flag, set the degradation speed condition to correspond to the upper limit temperature or the raised upper limit temperature as applicable when the degradation speed condition is set.

* * * * *